United States Patent
Schneider et al.

(10) Patent No.: US 7,126,870 B2
(45) Date of Patent: Oct. 24, 2006

(54) INTEGRATED SEMICONDUCTOR MEMORY WITH SENSE AMPLIFIER

(75) Inventors: Helmut Schneider, München (DE); Michael Bernhard Sommer, Raubling (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/068,491

(22) Filed: Mar. 1, 2005

(65) Prior Publication Data
US 2005/0207251 A1    Sep. 22, 2005

(30) Foreign Application Priority Data
Mar. 2, 2004    (DE)    ........... 10 2004 010 191

(51) Int. Cl.
G11C 7/02    (2006.01)
G11C 7/00    (2006.01)

(52) U.S. Cl. .................... 365/207; 365/203
(58) Field of Classification Search ........... 365/207, 365/203, 189.02, 189.03
See application file for complete search history.

(56) References Cited

U.S. PATENT DOCUMENTS

| | | | |
|---|---|---|---|
| 4,954,992 A | * | 9/1990 | Kumanoya et al. ........ 365/207 |
| 5,265,058 A | | 11/1993 | Yamauchi |
| 5,973,976 A | | 10/1999 | Sato |
| 6,028,803 A | * | 2/2000 | Kopley et al. ........ 365/208 |
| 6,034,885 A | * | 3/2000 | Chan ................ 365/149 |
| 6,137,739 A | * | 10/2000 | Kim ................ 365/205 |
| 2004/0037129 A1 | | 2/2004 | Fischer et al. |

OTHER PUBLICATIONS

Bursky, D., "Fast DRAMs Can Be Swapped for SRAM Caches", Electronic Design, Jul. 22, 1993, pp. 55, 56, 60, 62, 64-66, 70.

* cited by examiner

Primary Examiner—Anh Phung
(74) Attorney, Agent, or Firm—Edell, Shapiro & Finnan, LLC

(57) ABSTRACT

An integrated semiconductor memory includes a sense amplifier with a first subamplifier for driving memory cells of a first memory cell array and a second subamplifier for driving memory cells of a second memory cell array. The subamplifiers are connected via continuous lines to bit lines of the first memory cell array and to bit lines of the second memory cell array. The subamplifiers can be operated by applying a single control signal (MUXl, MUXr) in a first operating state for reading in, reading out, and refreshing information of the memory cells and in a second operating state for precharging the bit lines. Reduction of the signal line due to losses is avoided as a result of direct coupling the subamplifiers to the respective memory cell arrays.

16 Claims, 5 Drawing Sheets

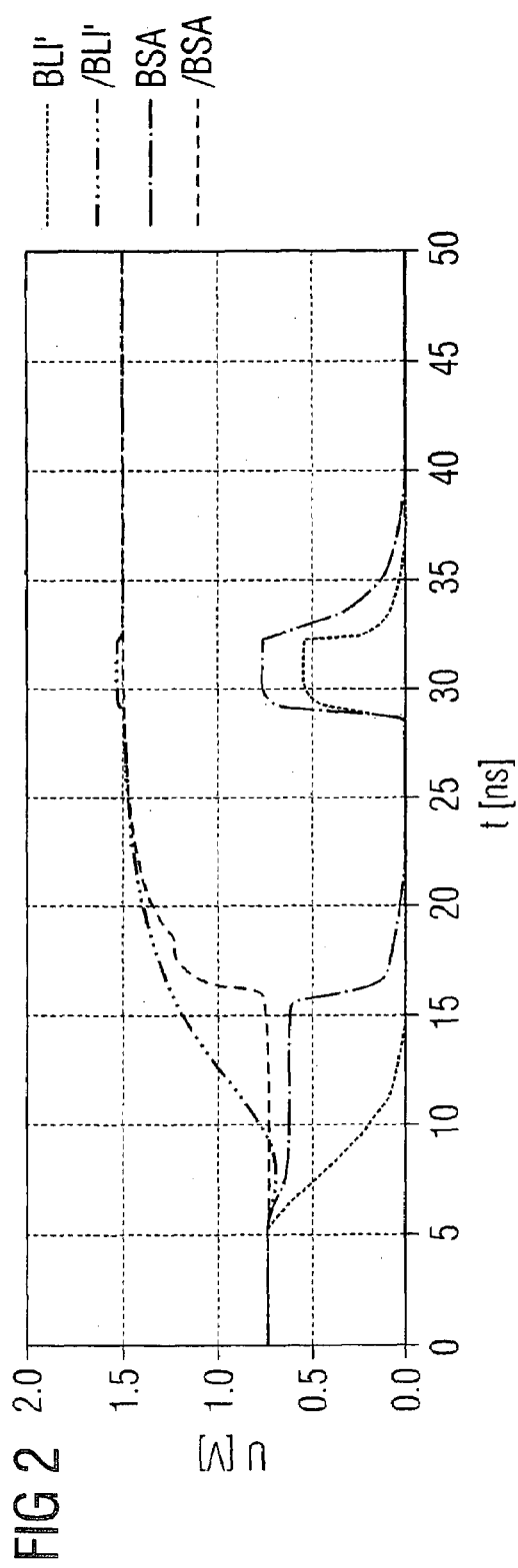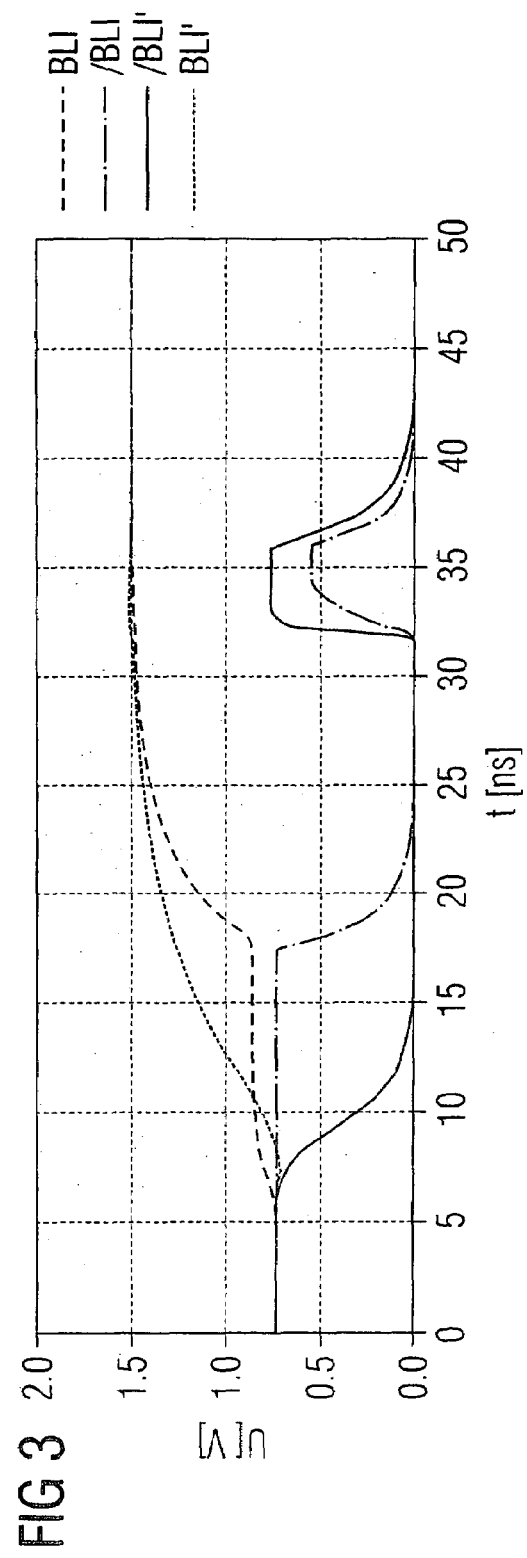

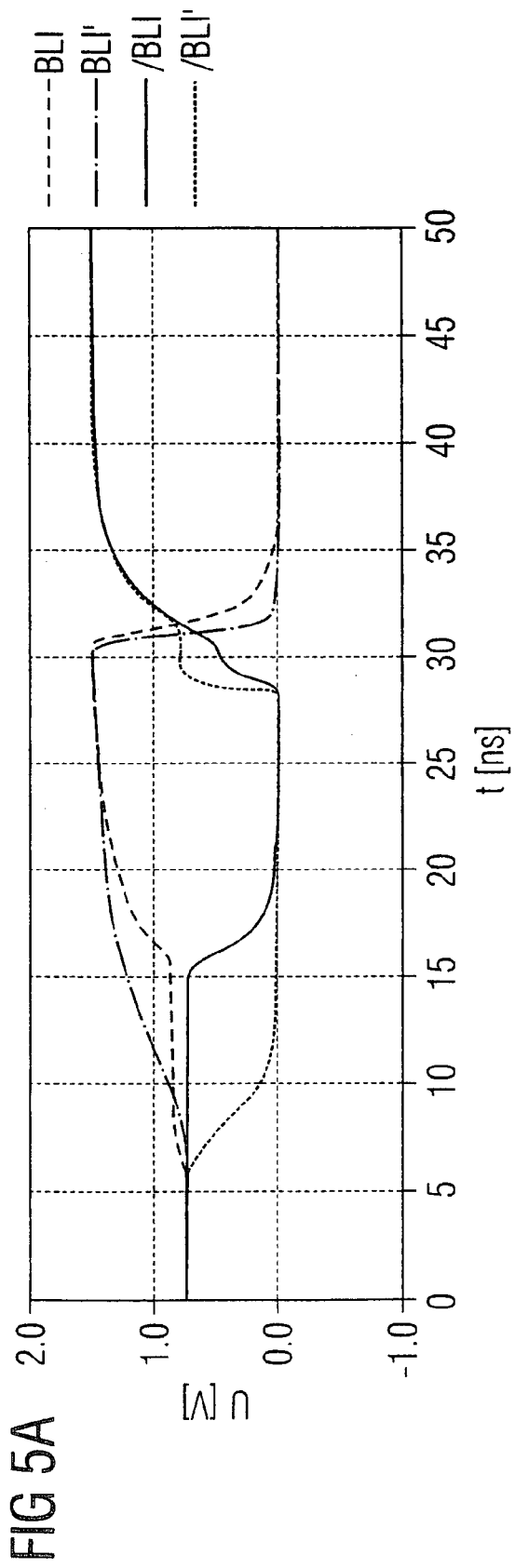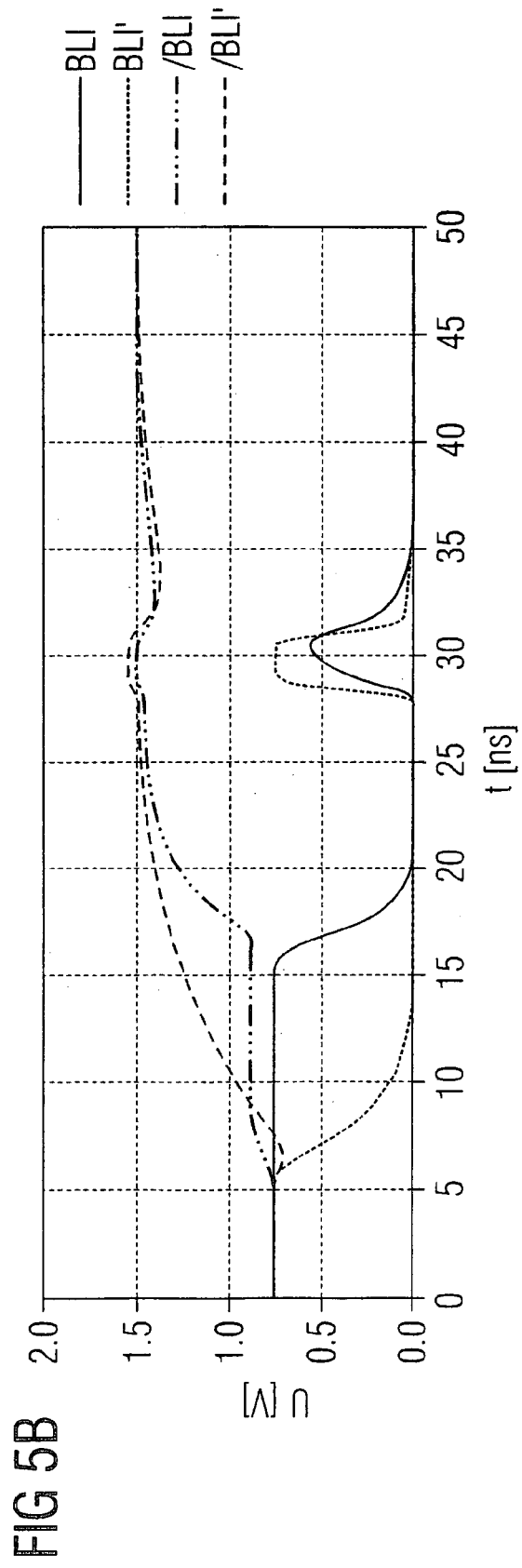

INTEGRATED SEMICONDUCTOR MEMORY WITH SENSE AMPLIFIER

CROSS REFERENCE TO RELATED APPLICATIONS

This application claims priority under 35 U.S.C. § 119 to German Application No. DE 10 2004 010 191.4, filed on Mar. 2, 2004, and titled "Integrated Semiconductor Memory with Sense Amplifier," the entire contents of which are hereby incorporated by reference.

Field of the Invention

The invention relates to an integrated semiconductor memory having a sense amplifier.

BACKGROUND

In an integrated semiconductor memory, for example, a DRAM (=Dynamic Random Access Memory) semiconductor memory, the memory cells are arranged in one or more memory cell arrays. An individual DRAM memory cell, which comprises a selection transistor and a storage capacitor, is connected to a bit line for reading in and reading out information. When the DRAM memory cell is activated for a read or write access, the selection transistor of the memory cell is turned on by a corresponding control signal on a word line. The storage capacitor of the DRAM memory cell is connected to the bit line via the turned-on path of the selection transistor. During a read-out operation, the charge stored on the storage capacitor alters the voltage potential of the bit line. If the storage capacitor is charged to a high voltage potential corresponding to a logic 1 state, for example, then a potential increase occurs during the read-out of the memory cell on the bit line. If the electrodes of the storage capacitor are charged to a low voltage potential corresponding to the logic 0 state, for example, then a potential decrease occurs during a read-out operation on the bit line. However, the quantity of charge present on the electrodes of the storage capacitor generally effects only a small potential fluctuation on the bit line. The bit line is therefore connected to a sense amplifier via a controllable switch when an item of information is being read into the memory cell or from the memory cell. When an item of information is read out, the sense amplifier amplifies a potential increase on the bit line to form a high voltage potential on the output side, whereas it converts a potential decrease into a low voltage potential on the output side.

When an item of information is written to the memory cell, the sense amplifier charges the storage capacitor of the relevant memory cell to the high voltage potential if a logic 1 information item is intended to be stored, and to the low voltage potential if a logic 0 information item is intended to be stored.

Since the storage capacitor can store the charge stored on its electrodes only over a very limited time, the charge is refreshed in a refresh operation. For this purpose, the memory cell is read internally from time to time. If the sense amplifier detects a potential increase on the bit line during this internal read-out operation, then it drives the bit line connected to the memory cell with a high voltage level. If the sense amplifier detects a potential decrease on the bit line, then it drives the bit line connected to the memory cell with the low voltage level. This ensures that a high or low charge level is always present on the electrodes of the storage capacitor.

In order to illustrate an integrated semiconductor memory constructed in this way, FIG. 6 illustrates a sense amplifier 100, which can drive a first memory cell array on its left-hand side via a bit line BLl and a complementary bit line /BLl with respect thereto and a second memory cell array on its right-hand side via a bit line BLr and a complementary bit line /BLr with respect thereto. On its left-hand side, an internal signal line BSA and a complementary signal line /BSA with respect thereto of the sense amplifier 100 are connected for this purpose, via a switching unit 50l to the bit line BLl and, respectively, the complementary bit line /BLl with respect thereto of the first memory cell array. In the event of an access to the second memory cell array on its right-hand side, the internal signal line BSA and the complementary signal line /BSA with respect thereto of the sense amplifier 100 can be connected via a switching unit 50r to a bit line BLr and, respectively, a complementary bit line /BLr with respect thereto.

The sense amplifier 100 furthermore comprises a circuit unit 20 for amplifying a logic 1 information item, a circuit unit 30 for amplifying a logic 0 information item, and a circuit unit 40, by which the bit lines BLl and BLr and the complementary bit lines /BLl and /BLr can be connected to a local data line LDQ and, respectively, a complementary local data line /LDQ with respect thereto. The local data lines LDQ and /LDQ are generally connected to a secondary sense amplifier (not illustrated here).

The circuit unit 20 comprises the two switching transistors 21 and 22, which are designed as p-channel transistors, for example. The control terminal of the switching transistor 21 is connected to the complementary signal line /BSA of the sense amplifier and the control terminal of the switching transistor 22 is connected to the signal line BSA of the sense amplifier. The two switching transistors are connected to one another via their common terminal A20. The common terminal A20 is connected via a switching transistor TH, which can be controlled by a control signal PSET, to the terminal for applying a high voltage potential VBLH corresponding to the logic 1 information item. Furthermore, the terminal A20 is connected to the signal line BSA via the controllable path of the switching transistor 21 and to the complementary signal line /BSA of the sense amplifier via the controllable path of the switching transistor 22.

The circuit unit 30 comprises two switching transistors 31 and 32 designed as n-channel transistors. A control terminal of the switching transistor 31 is connected to the complementary signal line /BSA of the sense amplifier. A control terminal of the switching transistor 32 is connected to the signal line BSA of the sense amplifier. The two switching transistors 31 and 32 are connected to one another via a common terminal A30. The terminal A30 is connected via a switching transistor TL, which can be controlled by a control signal NSET, to a terminal for applying a low voltage potential VBLL corresponding to the logic 0 information item. The terminal A30 is connected to the signal line BSA via the controllable path of the switching transistor 31 and to the signal line /BSA via the controllable path of the switching transistor 32.

The circuit unit 40 comprises the two switching transistors 41 and 42, which are designed as n-channel transistors, for example. The two switching transistors can be controlled by a control signal CSL applied to a common control terminal CIN. The signal line BSA of the sense amplifier 100 is connected to the local data line LDQ via the controllable path of the switching transistor 41. The complementary signal line /BSA of the sense amplifier 100 is connected to the complementary local data line /LDQ via the controllable path of the switching transistor 42.

The signal line BSA and the complementary signal line /BSA of the sense amplifier are connected via the switching unit 50l to the bit line BLl and, respectively, the complementary bit line /BLl with respect thereto for driving a memory cell SZ in the first memory cell array. For this purpose, the switching unit 50l comprises a switching transistor 51l and a switching transistor 52l, which are designed as n-channel transistors, for example. The two switching transistors can be controlled via a common control terminal MINl for applying a control signal MUXl. The signal line BSA and the complementary signal line /BSA with respect thereto of the sense amplifier 100 are connected via the switching unit 50r to the bit line BLr and, respectively, the complementary bit line /BLr with respect thereto for driving a memory cell in the right-hand memory cell array. The switching unit 50r comprises the switching transistor 51r, via the controllable path of which the signal line BSA of the sense amplifier can be connected to the bit line BLr, and a switching transistor 52r, via the controllable path of which the complementary signal line /BSA can be connected to the complementary bit line /BLr. The two switching transistors can be controlled via a common control terminal MINr for applying a control signal MUXr.

A circuit unit 10 for precharging the bit lines to a common precharge potential is connected between the bit line BLl and the complementary bit line /BLl of the first memory cell array and the bit line BLr and the complementary bit line /BLr of the second memory cell array. The circuit units 10 in the first and second memory cell arrays for this purpose comprise a switching transistor 11, via which the bit lines BLl and BLr can be connected to their complementary bit lines /BLl and /BLr. The bit lines BLl and BLr are furthermore connected via a switching transistor 12 and a current limiter transistor TB, which is driven by a control signal VINT, to a terminal VEINl and, respectively, a terminal VEINr for applying a precharge voltage VBLEQ. The complementary bit lines /BLl and /BLr are connected via a switching transistor 13 and the current limiter transistor TB to the terminal VEINl and VEINr, respectively, for applying the precharge potential VBLEQ.

For reasons of clarity, a memory cell SZ is connected only to the bit line BLl of the first memory cell array and a storage capacitor SC' is connected to the complementary bit line /BLl with respect thereto of the first memory cell array. The memory cell SZ is designed as a DRAM memory cell and comprises a selection transistor AT, via the controllable path of which a storage capacitor SC is connected to the bit line BLl. The selection transistor AT can be controlled by applying a control signal WL to its control terminal WIN.

Operation of the sense amplifier 100 and the circuit components connected thereto is described below. For reading an item of information into the memory cell or from the memory cell, the sense amplifier 100 is switched into a first operating state. The selection transistor AT is turned on, as a result of the memory cell SZ being driven with the control signal WL. The storage capacitor SC is connected to the bit line BLl via the controllable path of the selection transistor. In the first operating state of the sense amplifier 100, the switching transistors 11, 12 and 13 of the circuit unit 10 of the first memory cell array are turned off by the applying a control signal EQL to their common control terminal EINl. The two switching transistors 51l and 52l are turned on by applying a corresponding state of the control signal MUXl. The bit line BLl and the complementary bit /BLl are connected via the turned-on paths of the switching transistors 51l and 52l to the signal line BSA and, respectively, the complementary signal line /BSA of the sense amplifier 100. At the same time, the two switching transistors 51r and 52r are turned off by applying a corresponding state of the control signal MUXr to the control terminal MINr, so that the signal line BSA and the complementary signal /BSA of the sense amplifier 100 are disconnected from the bit lines BLr and the complementary bit line /BLr of the second memory cell array. The two switching transistors TL and TH are turned on by the control signal NSET and PSET, respectively, so that the high voltage potential VBLH is present at the common terminal A20 of the two p-channel switching transistors 21 and 22 and the low voltage potential VBLL is present at the common terminal A30 of the two switching transistors 31 and 32.

If it is assumed that the bit lines and complementary bit lines are charged to the precharge potential VBLEQ before a read access, then the potential increase relative to the precharge potential VBLEQ, as described above, occurs during the read-out of an information item that is stored in the memory cell SZ on the bit line BLl. The potential increase is transmitted onto the signal line BSA of the sense amplifier via the switching transistor 51l. The potential increase on the signal line BSA causes the switching transistor 32 to be turned on. In this case, the low voltage potential VBLL is present on the complementary signal line /BSA and is transmitted onto the complementary bit line /BLl via the turned-on switching transistor 52l. The storage capacitor SC' is thereby charged to the low voltage potential VBLL. As a result of the low voltage level VBLL on the complementary signal line /BSA of the sense amplifier 100, the switching transistor 31 is turned off, whereas the switching transistor 21 is turned on. The high voltage level VBLH arises on the signal line BSA via the turned-on p-channel transistor 21, and in turn reliably turns off the switching transistor 22. In this switching configuration, a high voltage potential VBLH corresponding to the logic 1 information item is written back to the memory cell SZ (refresh operation). In order to read out the information stored in the memory cell SZ, the switching transistors 41 and 42 are additionally turned on by the driving with a corresponding state of the control signal CSL, so that the signal line BSA is connected to the local data line LDQ and the complementary signal line /BSA is connected to the complementary data line /LDQ.

If a logic 0 information item was stored in the memory cell SZ, then a potential decrease relative to the precharge potential VBLEQ occurs on the bit line BLl upon activation of the selection transistor AT. The potential decrease of the bit line BLl is transmitted onto the signal line BSA of the sense amplifier 100 via the turned-on switching transistor 51l. The potential decrease on the signal line BSA causes the p-channel switching transistor 22 to be turned on. As a result, the high voltage level VBLH arises on the complementary signal line /BSA. As a result, the switching transistor 21 is reliably turned off and the switching transistor 31 is turned on. The low voltage level VBLL arises on the signal line BSA via the turned-on switching transistor 31, and in turn reliably turns off the switching transistor 32. In this switching configuration of the sense amplifier 100, the low voltage level VBLL corresponding to the logic 0 information item is written back to the memory cell SZ (refresh operation). The storage capacitor SC' connected to the complementary bit line /BLl is charged to the high voltage level VBLH, by contrast. If the logic 0 information item is intended to be read from the memory cell SZ, then the two switching transistors 41 and 42 are turned on by the driving with a corresponding state of the signal CSL, so that the signal line BSA is connected to the local data line LDQ and the complementary signal line /BSA is connected to the complementary data line /LDQ.

If an item of information is intended to be read into or from a memory cell of the second memory cell array on the right-hand side of the sense amplifier 100, then the switching transistors 51*l* and 52*l* are turned off. The switching transistors 51*r* and 52*r* are turned on by the driving with a corresponding state of the control signal MUXr, so that, in this case, the bit lines BLr and /BLr are connected to the signal lines BSA and /BSA of the sense amplifier 100. The switching transistors 11, 12 and 13 of the circuit unit 10 of the second memory cell array are turned off. The functioning of the sense amplifier 100 and its circuit components 20, 30 and 40 otherwise corresponds to the function described in the event of an access to the first memory cell array.

Between a read and write access to a memory cell, the sense amplifier is operated in a second operating state. In the second operating state of the sense amplifier, the bit lines are charged to the common precharge potential VBLEQ. For this purpose, the respective switching transistors 11, 12 and 13 of the circuit units 10 of the first and second memory cell arrays are turned on by the driving with a corresponding state of the control signal EQL and EQLr, respectively. The bit lines BLl and BLr are connected to the precharge potential VBLEQ via the respective current limiter transistors TB and the respectively turned-on switching transistors 12. Furthermore, the complementary bit lines /BLl and /BLr are likewise connected to the precharge potential VBLEQ via the respectively turned-on switching transistors 13 and the respective current limiter transistors TB. The bit lines and their complementary bit lines are connected to one another in each case via the turned-on switching transistors 11.

It is know that in a sense amplifier constructed in this way and connected via switching transistors to a bit line pair of a left-hand and right-hand memory cell array, the switching transistors are used to increase the total capacitance of a complementary bit line of a bit line pair during a read operation. This makes it possible to reduce the parasitic capacitive coupling between bit lines of a bit line pair during the read operation.

There are numerous disadvantages associated with a sense amplifier of this type. Although the switching transistors 51 and 52, which are generally designed as n-channel transistors and connect the signal line BSA and the complementary signal line /BSA of the sense amplifier 100 to the bit lines BL and the complementary bit lines /BL, respectively, are turned on in the first operating state of the sense amplifier, the switching transistors 51, 52 still represent a resistance. An increase in the channel resistance of the switching transistors occurs when the integrated semiconductor memory is operated in a low temperature range, since the threshold voltage of the switching transistors increases at low temperatures. A signal, for example, the voltage signal VBLH corresponding to the logic 1 information item, which passes via one of these transistors, is thus attenuated. With the use of n-channel transistors, problems occur when transmitting high voltage levels from the bit line BL onto the signal line.

In order to improve the current yield, the switching transistors are therefore driven with high control voltages for the purpose of turning them on. Such control voltages are in the region of 2.9 V, for example. In order to prevent the gate contact from being destroyed by these control voltages, the oxide layer below the gate contact is made very thick. The transistors used are therefore generally thick-oxide transistors.

In order to further increase the current yield of the switching transistors connected between the bit lines of the memory cell arrays and the signal lines of the sense amplifiers, transistors with large width and length ratios are used. However, fabrication of switching transistors with thick oxide layers and large channel widths requires a large amount of space in the circuit layout.

Besides increasing the channel widths, attempts have been made to increase the width and length ratio by reducing the channel lengths of the switching transistors. However, transistors with short channel lengths exhibit large fluctuations in the threshold voltage. Process fluctuations in the dimensioning of the channel length are therefore accompanied by large fluctuations in the threshold voltage.

SUMMARY

An integrated semiconductor memory with a sense amplifier can avoid a signal attenuation on the bit line during a read and write access and reduce the area requirement for fabricating the sense amplifier and the influence of process fluctuations on the operation of the sense amplifier. A method for operating such an integrated semiconductor memory is also desirable.

Such an integrated semiconductor memory with a sense amplifier includes a memory cell array having a first bit line and a second bit line. The sense amplifier includes a first signal line, a second signal line, and a first control terminal for application of a first control signal. The first and second bit lines of the memory cell array and the first and second signal lines of the sense amplifier are formed as continuous interconnectors. The first bit line of the memory cell array is connected to the first signal line of the sense amplifier via one continuous interconnect and the second bit line of the memory cell array is connected to the second signal line of the sense amplifier via a further continuous interconnect. The sense amplifier includes a first circuit unit with a first switching transistor with a first control terminal, a second switching transistor with a second control terminal, and a third switching transistor with a third control terminal. The respective control terminals of the switching transistors of the first circuit unit are connected to the first control terminal for applying the first control signal. The first circuit unit connects the first signal line of the sense amplifier to the second signal line of the sense amplifier at high impedance or at low impedance in a manner dependent on a state of the first control signal. The sense amplifier includes a first and second switching transistor. Each switching transistor has a control terminal. Each control terminal is driven by the first control signal. The sense amplifier further includes a second circuit unit for feeding in a first voltage potential onto the first or second signal line of the sense amplifier. The first voltage potential can be fed to the second circuit unit via the first switching transistor of the sense amplifier. The second circuit unit is designed to feed the first voltage potential into the first or second signal line of the sense amplifier, if the first switching transistor of the sense amplifier is turned on by the first control signal. The sense amplifier further includes a third circuit unit for feeding in a second voltage potential into the first or second signal line of the sense amplifier. The second voltage potential can be fed to the third circuit unit via the second switching transistor of the sense amplifier. The third circuit unit is designed to feed the second voltage potential into the first or second signal line of the sense amplifier, if the second switching transistor of the sense amplifier is turned on by the first control signal. The first and second switching transistors of the sense amplifier are designed as a switching transistor of the n-channel type. The switching transistors of the first circuit unit are designed as thick-oxide switching transistors of the p-channel type.

Since the first and second signal lines of the sense amplifier are connected via a continuous interconnect to the bit line of the connected memory cell array, undesirable signal attenuations do not occur when a voltage level is transmitted from the signal line to the bit line. The undesirable signal attenuations exist, for example, when the signal lines of the sense amplifier are connected to the bit lines of the memory cell array via switching transistors. Furthermore, a precharge operation or a refresh or read-out operation can be activated by the states of a single control signal because the control terminals of the first and second switching transistors and the control terminals of the switching transistors of the first circuit unit are driven by a common control signal. In order that the switching transistors of the sense amplifier and the switching transistors of the first circuit unit behave differently when driven with a state of the common control signal, the first and second switching transistors of the sense amplifier are designed as switching transistors of the n-channel type and the switching transistors of the first circuit unit are designed as p-channel types. In order to reliably turn on the n-channel switching transistors of the sense amplifier, high control voltage levels of the common control signal are used. In order to prevent these high control voltage levels from also simultaneously loading the control terminals of the p-channel switching transistors of the first circuit unit, the switching transistors of the first circuit unit are designed as thick-oxide switching transistors.

The sense amplifier of the integrated semiconductor memory, for example, includes a first input terminal for application of a precharge voltage. The first input terminal for application of the precharge voltage can be connected, in a manner dependent on the state of the first control signal, to the first signal line of the sense amplifier via the first and second switching transistors of the first circuit unit and to the second signal line via the first and third switching transistors of the first circuit unit.

In accordance with the integrated semiconductor memory, a terminal for applying a first voltage potential is provided. The second circuit unit includes an input terminal, a first switching transistor with a first control terminal, and a second switching transistor with a second control terminal. The control terminal of the first switching transistor of the second circuit unit is connected to the second signal line of the sense amplifier. The control terminal of the second switching transistor of the second circuit unit is connected to the first signal line of the sense amplifier. The first switching transistor of the second circuit unit is connected between the input terminal of the second circuit unit and the first signal line of the sense amplifier. The second switching transistor of the second circuit unit is connected between the input terminal of the second circuit unit and the second signal line of the sense amplifier. The first switching transistor of the sense amplifier is connected between the terminal for application of the first voltage potential and the input terminal of the second circuit unit.

In one exemplary embodiment of the invention, the first and second switching transistors of the second circuit unit are p-channel field effect transistors.

In accordance with the integrated semiconductor memory, a terminal for applying a second voltage potential is provided. The third circuit unit includes an input terminal, a first switching transistor with a first control terminal, and a second switching transistor with a second control terminal. The control terminal of the first switching transistor of the third circuit unit is connected to the second signal line of the sense amplifier. The control terminal of the second switching transistor of the third circuit unit is connected to the first signal line of the sense amplifier. The first switching transistor of the third circuit unit is connected between the input terminal of the third circuit unit and the first signal line of the sense amplifier. The second switching transistor of the third circuit unit is connected between the input terminal of the third circuit unit and the second signal line of the sense amplifier. The second switching transistor of the sense amplifier is connected between the terminal for application of the second voltage potential and the input terminal of the third circuit unit.

The first and second switching transistors of the third circuit unit are, for example, designed as n-channel field effect transistors.

In accordance with an exemplary embodiment of the integrated semiconductor memory, a first data line and a second data line are provided. The integrated semiconductor memory includes a second control terminal for applying a second control signal. The sense amplifier includes a fourth circuit unit for connecting the first signal line to the first data line and for connecting the second signal line to the second data line the fourth circuit unit containing a control terminal. Furthermore, a third switching transistor with a control terminal is provided. The third switching transistor of the sense amplifier is connected between the second control terminal of the sense amplifier and the control terminal of the fourth circuit unit. The control terminal of the third switching transistor of the sense amplifier is connected to the first control terminal for applying the first control signal. The second control terminal of the sense amplifier is connected to the control terminal of the fourth circuit unit at low impedance or at high impedance in a manner dependent on the state of the first control signal. In a manner dependent on a state of the second control signal, the first signal line is connected to the first data line and the second signal line is connected to the second data line at low impedance or at high impedance.

The third switching transistor of the sense amplifier is, for example, an n-channel field effect transistor.

In accordance with a further embodiment of the integrated semiconductor memory, the fourth circuit unit includes a first switching transistor with a first control terminal, and a second switching transistor with a second control terminal. The control terminal of the first switching transistor of the fourth circuit unit is connected to the control terminal of the fourth circuit unit. The control terminal of the second switching transistor of the fourth circuit unit is connected to the control terminal of the fourth circuit unit. The first switching transistor of the fourth circuit unit is connected between the first signal line of the sense amplifier and the first data line. The second switching transistor of the fourth circuit unit is connected between the second signal line of the sense amplifier and the second data line.

The first and second switching transistors of the fourth circuit unit are, for example, an n-channel field effect transistor.

According to the integrated semiconductor memory according to the invention, the sense amplifier includes a first subamplifier and a second subamplifier. The subamplifiers include first, second, third, and fourth circuit units. The switching transistors of the first and second circuit units of the subamplifiers are introduced in a common well.

The first bit line is connected to a memory cell. The memory cell includes a selection transistor and a first storage capacitor. The second bit line is connected to a second storage capacitor. The first storage capacitor of the memory cell is charged to the first voltage potential and the second storage capacitor is charged to the second voltage potential.

A method for operating an integrated semiconductor memory includes applying the first state of the first control signal to a first control terminal of the sense amplifier. The first, second, and third switching transistors of the first circuit unit are subsequently controlled into the off state. The first, second, and third switching transistors of the sense amplifier are then controlled into the on state. A first state of the second control signal is subsequently applied to the second control terminal of the sense amplifier. The switching transistors of the fourth circuit unit are thereupon controlled into the on state. As a result, the first signal line of the sense amplifier is connected to the first data line and the second signal line of the sense amplifier is connected to the second data line at low impedance. A read or write access is then carried out in the memory cell array.

One embodiment of the method for operating the integrated semiconductor memory according to the invention includes applying a second state of the second control signal to the second control terminal of the sense amplifier. The switching transistors of the fourth circuit unit are subsequently controlled into the off state. As a result, the first signal line of the sense amplifier is connected to the first data line and the second signal line of the sense amplifier is connected to the second data line at high impedance. A refresh operation is then carried out in the memory cell array.

A further embodiment of the method for operating the integrated semiconductor memory according to the invention includes applying a second state of the second control signal to the second control terminal of the sense amplifier. The switching transistors of the fourth circuit unit are subsequently controlled into the off state. As a result, the first signal line of the sense amplifier is connected to the first data line and the second signal line of the sense amplifier is connected to the second data line at high impedance.

The second state of the first control signal is then applied to the first control terminal of the sense amplifier. The first, second, and third switching transistors of the first circuit unit are subsequently controlled into the on state. The first, second, and third switching transistors of the sense amplifier are subsequently controlled into the off state. The first and second signal lines of the sense amplifier and the first and second bit lines of the memory cell array are then precharged to a medium voltage potential between the first voltage potential and the second voltage potential.

BRIEF DESCRIPTION OF THE FIGURES

The invention is explained in more detail below on the basis of exemplary embodiments. In the figures:

FIG. 2 shows a voltage/time diagram of a first read access according to the invention, FIG. 3 shows a voltage/time diagram of a second read access according to the invention, FIG. 5A shows a voltage/time diagram of a third read and write access according to the invention, FIG. 5B shows a voltage/time diagram of a fourth read and write access according to the invention.

DETAILED DESCRIPTION

Figure 1:
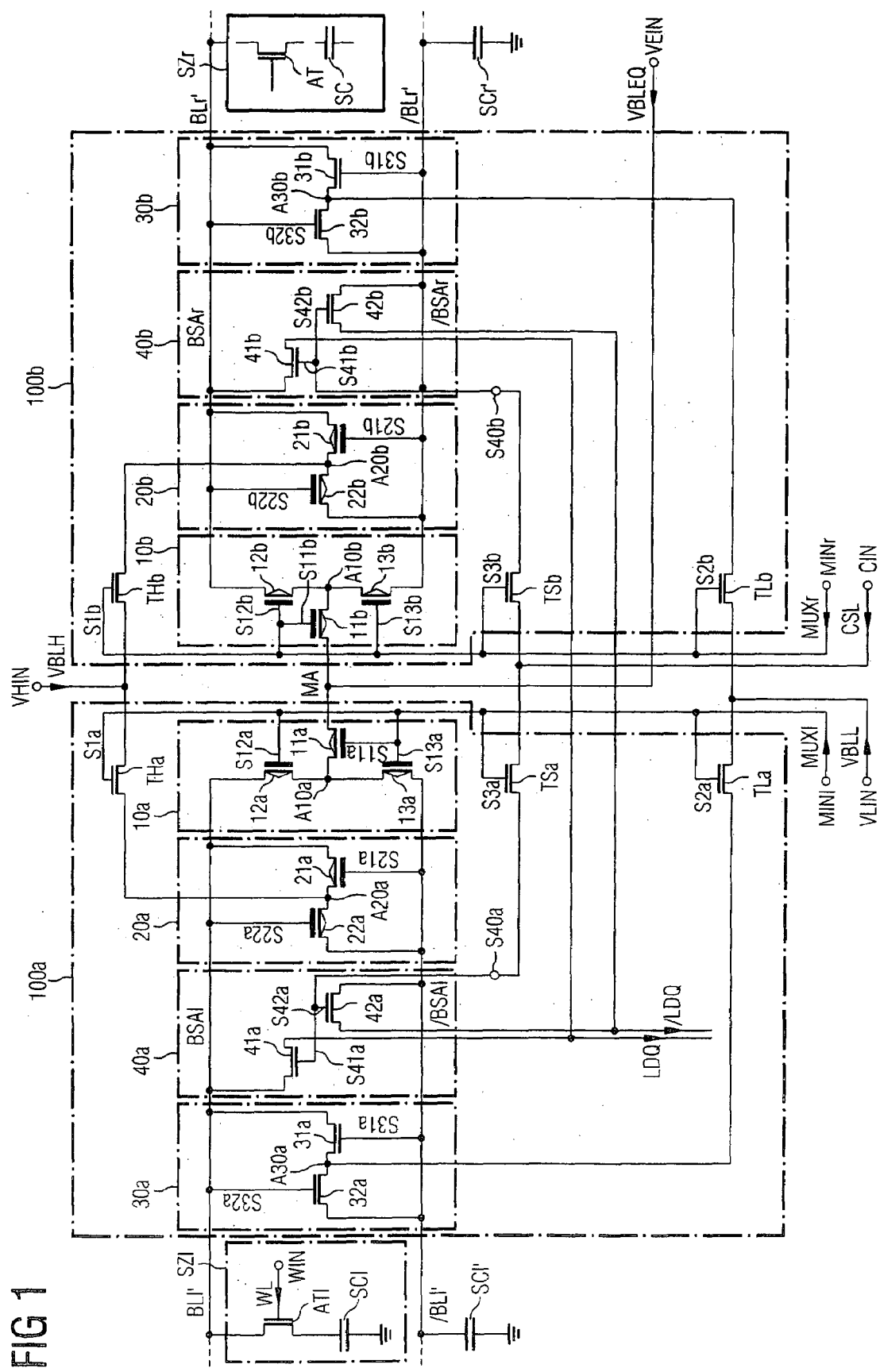
FIG. 1 shows an embodiment of a sense amplifier according to the invention.

FIG. 1 shows a sense amplifier of an integrated semiconductor memory according to the invention, which enables direct access to the bit line BLl' and the complementary bit line /BLl' with respect thereto of a first memory cell array and to the bit line BLr' and the complementary bit line /BLr' with respect thereto of a second memory cell array. Circuit components in FIG. 1 which are identical to circuit components of FIG. 6 in terms of construction and functioning are not discussed in further detail here. With regard to their description, reference is made to FIG. 6. For simplicity, a memory cell SZl is connected, for example, to the bit line BLl' leading into the first memory cell array. The memory cell is, for example, a DRAM memory cell. A storage capacitor SCl' is connected to the complementary bit line /BLl' of the left-hand memory cell array.

Figure 6:
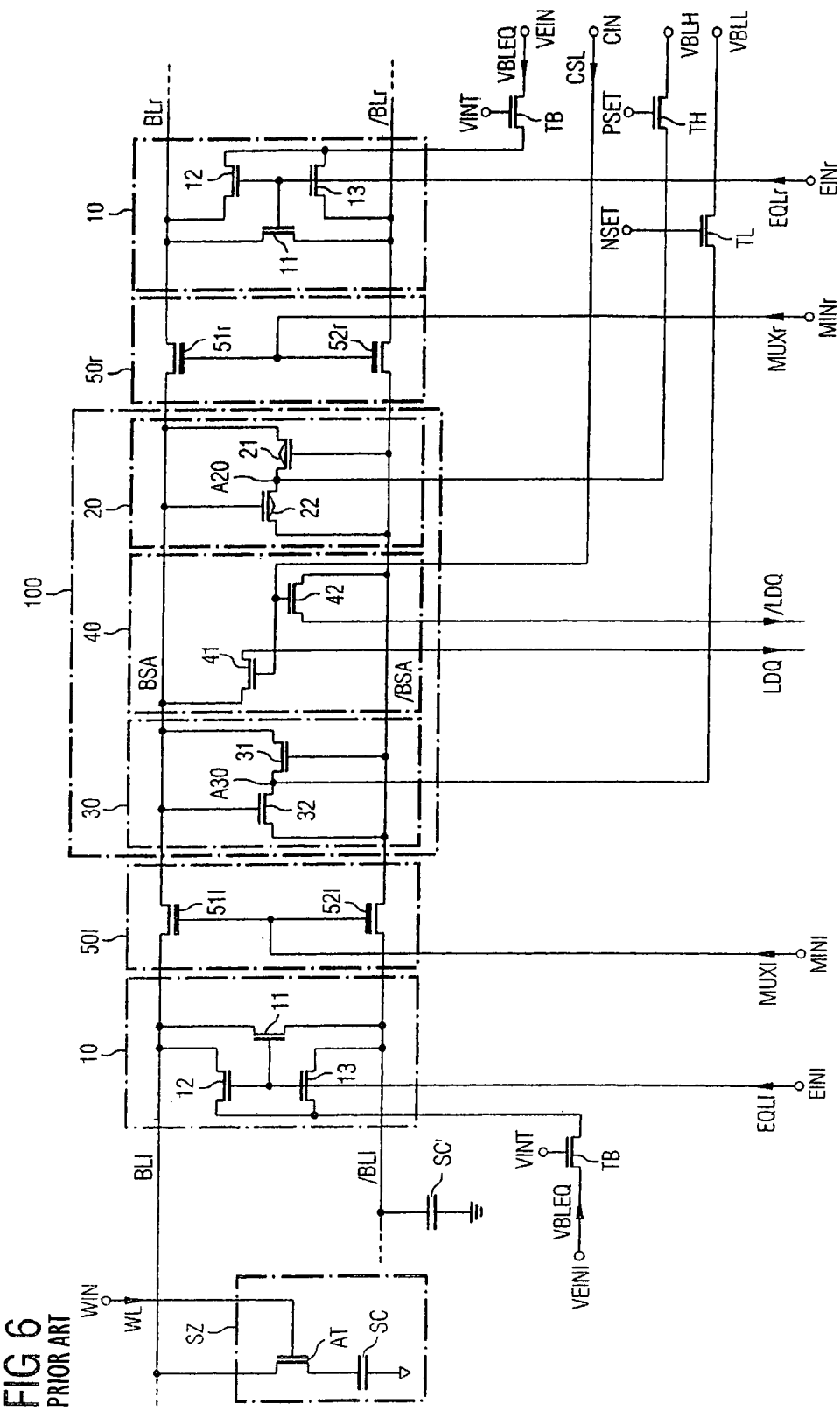
FIG. 6 shows a memory cell array with a sense amplifier according to the prior art.

The sense amplifier according to the invention includes two identically constructed subamplifiers 100a and 10b, in which an internal signal line BSAl and BSAr and a complementary signal line /BSAl and /BSAr with respect thereto are connected to the bit lines BLl' and BLr' and, respectively, the complementary bit lines /BLl' and /BLr' with respect thereto of the first and second memory cell arrays. In contrast to the embodiment of a sense amplifier as illustrated in FIG. 6, the signal lines of the sense amplifier are connected to the bit lines of the connected memory cell arrays directly via continuous interconnects. Thus, no switches, such as the switching transistors 50 in FIG. 6, for example, are connected between the signal lines and the bit lines. The subamplifiers 100a and 100b include the circuit units 10a, 20a, 30a, and 40a and, respectively, 10b, 20b, 30b and 40b. The circuit components 10a, 20a, 30a, and 40a are used for operating the first memory cell array, whereas the circuit components 10b, 20b, 30b, and 40b are used for operating the second memory cell array. The circuit units 10a, 20a, 30a and 40a are controlled by applying a first control signal MUXl to the control terminal MINl for activation of the first subamplifier 100a. The circuit units 10b, 20b, 30b and 40b are controlled by applying a second control signal MUXr to the control terminal MINr for activation of the second subamplifier 10b. Since the circuit units for operating the first and second memory cell arrays are constructed identically, only the circuit units with the designation a are discussed in detail below. The function of the circuit units with the designation b is outlined briefly. The description below in connection with the first subamplifier 100a is also relevant to the second subamplifier 100b.

The circuit unit 10a of the first subamplifier 100a is used for precharging the bit line BLl' and the complementary bit line /BL1' to the precharge potential VBLEQ. For this purpose, the circuit unit 10a includes three switching transistors 11a, 12a, and 13a, which are each designed as p-channel transistors. The controllable paths of the three switching transistors are interconnected via a common terminal A10a. The terminal VEIN for applying the precharge voltage VBLEQ is connected to the common terminal A10a via the controllable path of the switching transistor A10a. The signal line BSA1 of the first subamplifier 100a is connected to the common terminal A10a via the controllable path of the switching transistor 12a. The complementary signal line /BSA1 of the first subamplifier 100a is likewise connected to the common terminal A10a of the first subamplifier 100a via the controllable path of the switching transistor 13a. The control terminals S11a, S12a, and S13a of the switching transistors 11a, 12a and 13a are connected to the control terminal MIN1 for applying the first control signal MUX1.

The circuit unit 20a corresponds to the circuit component 20 illustrated in FIG. 6 and amplifies a voltage level on the bit line BL1' and the complementary bit line /BL1' with respect thereto of the first memory cell array to the high voltage potential VBLH corresponding to the logic 1 information item. Circuit unit 20a includes two switching transistors 21a and 22a, which are designed as p-channel transistors, for example. The controllable paths of the two switching transistors 21a and 22a are interconnected at a common terminal A20a. The terminal A20a is connected via a first controllable switch THa, which can be controlled via a control terminal S1a, to a terminal VHIN for applying the high voltage potential VBLH.

The circuit component 30a corresponds to the circuit component 30 of FIG. 6 and amplifies a voltage level of the bit line BL1' and the complementary bit line /BL1' with respect thereto to the low voltage potential VBLL corresponding to the logic 0 information item. Circuit component 30a includes two switching transistors 31a and 32a, which are designed as n-channel transistors, for example. The controllable paths of the two switching transistors 31a and 32a are connected to one another via a common terminal A30a. The common terminal A30a of the two switching transistors is connected via a second controllable switch TLa, which can be controlled via a control terminal S2a, to a terminal VLIN for applying the low voltage potential VBLL.

The circuit unit 40a corresponds to the circuit unit 40 of FIG. 6, and includes two switching transistors 41a and 42a, which are designed as n-channel transistors, for example, and via which the signal line BSA1 and the complementary signal line /BSA1 with respect thereto of the first subamplifier 100a can be connected to a local data line LDQ and a complementary local data line /LDQ with respect thereto. The control terminals S41a and S42a of the two switching transistors 41a and 42a are connected to a control terminal S40a of the circuit unit 40a. The control terminal S40a of the circuit unit 40 is connected via a third controllable switch TSa, which can be controlled via a control terminal S3a, to a control terminal CIN for applying a third control signal CSL.

The controllable switches THa, TSa and TLa are designed as n-channel switching transistors in the present exemplary embodiment of the sense amplifier according to the invention.

A write and read access to a memory cell in the first memory cell array is described below. For this purpose, the first subamplifier 100a connected to the first memory cell array is activated. For this purpose, the first control signal MUX1 with a high signal level is applied to the control terminal MIN1.

For a write, read, or refresh operation, the first subamplifier 100a of the sense amplifier is operated in a first operating state. The bit line BL1' is electrically insulated from the complementary bit line /BL1' in this first operating state. The switching transistors 11a, 12a, and 13a, which are designed as p-channel transistors, are turned off by the high signal level of the first control signal MUX1. At the same time, the controllable switches THa, TSa, and TLa (designed as n-channel switching transistors) are turned on. Consequently, the high voltage potential VBLH is present at the terminal point A20a of the circuit unit 20a. The low voltage potential VBLL is present at the terminal point A30a. The third control signal CSL is present at the control terminal S40a.

For a read access, the storage capacitor SC1 of the memory cell SZ1 is conductively connected to the bit line BL1' by driving with the control signal WL on the word line. The bit line BL1' and the signal line BSA1 of the first subamplifier are charged to the precharge potential VBLEQ at this point in time.

If a logic 1 information item was stored in the memory cell SZ1, then a potential increase relative to the precharge potential VBLEQ appears on the bit line BL1' of the first memory cell array and on the signal line BSA1 of the first subamplifier 100a. As a result, the switching transistor 32a is turned on, so that the storage capacitor SC1' of the complementary bit line /BL1' is charged to the low voltage potential VBLL. As a result of the low voltage level on the signal line /BSA1 of the first subamplifier, the switching transistor 31a is reliably turned off, whereas the switching transistor 21a is turned on. The storage capacitor SC1 of the memory cell SZ1 is thus charged to the high voltage potential VBLH. The switching transistor 22a is reliably turned off as a result of the high voltage potential in the signal line BSA1. The charge present on the storage capacitors SC1 and SC1' is refreshed to a full high and low charge level, respectively, by these switching operations (refresh operation).

If a logic 0 information item was stored in the memory cell SZ1, then the storage capacitor SC1' is charged to the high voltage potential VBLH by the turned-on switching transistor 22a. The high voltage level VBLH turns on the switching transistor 31a. As a result, the storage capacitor SC1 of the memory cell SZ1 is charged to the low voltage potential VBLL. The switching transistors 21a and 32a are reliably turned off in this case. As a result of the connection of the storage capacitor SC1 to the terminal VLIN, the storage capacitor SC1 is charged to the low voltage potential VBLL, whereas the storage capacitor SC1' is charged to the high voltage potential VBLH. This state corresponds to the refreshing of the logic 0 information item into the memory cell SZ1 (refresh operation).

If an item of information is intended to be read from the memory cell SZ or is intended to be written to the memory cell SZ, then the bit line BL1' and the signal line BSA1 have to be connected to the local data line LDQ and the complementary bit line /BL1' and the complementary signal line /BSA1 have to be connected to the complementary local data line /LDQ. For this purpose, in the first operating state of the subamplifier 100a, the third control signal CSL with a high signal level is applied to the control terminal CIN. As a result, the switching transistors 41a and 42a are turned on. The function of the circuit units 30a and 50a corresponds to the function described in the case of the refresh operation.

After a read or write access, the sense amplifier is generally operated in a second operating state. The bit line BLl' and the complementary bit line /BLl' are charged to the common precharge potential VBLEQ in the second operating state of the memory cell array. For this purpose, the control signal MUXl with a low signal level is applied to the control terminal MINl of the first subamplifier 100a. The controllable switches THa, TSa and TLa are thereby turned off. The switching transistors 11a, 12a, and 13a, which are designed as p-channel transistors, are turned on by the low signal level of the control signal MUXl. The signal line BSAl and the bit line BLl' are thereby connected to the complementary signal line /BSAl and the complementary bit line /BLl', respectively, at low impedance. Via the turned-on switching transistors 11a and 12a, the signal line BSAl and the bit line BLl' are connected to the terminal VEIN for applying the precharge potential VBLEQ at low impedance. The complementary signal line /BSAl and the complementary bit line /BLl' are likewise connected to the terminal VEIN for applying the precharge potential VBLEQ at low impedance via the turned-on switching transistors 13a and 11a. The bit line BLl' and the complementary bit line /BLl with respect thereto are thereby charged to the precharge potential VBLEQ in the second operating state of the memory cell array.

Since the switching transistors 11a, 12a and 13a are driven with the first control signal MUXl and the signal level of this control signal for switching the subamplifier into the first operating state can assume a voltage level of 2.9 V, for example, the switching transistors of the circuit component 10a are designed as thick-oxide transistors. In order to compensate for the increased leakage currents accompanying the latter, a star connection was used in the case of an exemplary arrangement of the switching transistors 11a, 12a, and 13a of the circuit unit 10a in accordance with FIG. 1 instead of the delta connection of the switching transistors 11, 12, and 13 in accordance with FIG. 6.

If a memory cell of the second memory cell array is to be accessed in the context of a read, write, or refresh operation, then the second subamplifier is operated in a first operating state and driven with a high signal level of the second control signal MUXr. In order to precharge the bit lines BLr' and the complementary bit line /Blr', the second subamplifier is operated in a second operating state by the second control signal MUXr with a low signal level being applied to the control terminal MINr. The function of the circuit units 10b, 20b, 30b and 40b corresponds to the function of the circuit components 10a, 20a, 30a and 40a of the first subamplifier in the first and second operating states of the second subamplifier.

FIG. 2 shows the voltage/time diagram of a first read access to the memory cell SZl of the first memory cell array. The curves BSA and /BSA show the profile of the voltage level on the signal line and the complementary signal line of the sense amplifier from FIG. 6. The curves BLl' and/or /BLl' show the profile of the signal level on the bit line and the complementary bit line of the first subamplifier 100a of FIG. 1. The read-out of a 0 information item from the memory cell SZl is illustrated. The complementary signal line /BSA of the sense amplifier of FIG. 6 remains charged at a precharge potential of 0.75 V up to the point in time of approximately 15 ns. During the read-out of the memory cell, a potential decrease occurs on the signal line BSA starting from a point in time of approximately 5 ns. After activation of the circuit units 20 and 30, starting from a point of time of approximately 15 ns, the signal line BSA is charged to a voltage level of 0 V, which corresponds to the low voltage potential VBLL, for example, and the complementary signal line /BSA is charged to a voltage level of 1.5 V, which corresponds to the high voltage potential VBLH, for example. The circuit component 40 is activated at the point in time of approximately 30 ns. A momentary potential increase occurs on the signal line BSA at this point in time since the local data lines were precharged to a voltage level of 1.5 V. The momentary potential increase has decayed again at the point in time of approximately 40 ns. In contrast thereto, it can be seen from the potential profiles on the bit line BLl' and /BLl' at the read-out operation commences as early as from a point in time of approximately 5 ns. Consequently, the bit line BLl' and the complementary bit line /BLl' with respect thereto assume the full high and low voltage level VBLH and VBLL, respectively, more rapidly.

FIGS. 3, 4A, 4B, 5A, and 5B show the voltage level on the bit line BL1 and the complementary bit line /BL1 with respect thereto of the sense amplifier of FIG. 6 in comparison with the voltage level of the bit line BLl' and the complementary bit line /BLl' with respect thereto of the subamplifier 100a of the sense amplifier of FIG. 1.

FIG. 3 shows the voltage/time diagram of a second read access to the memory cell SZl of the first memory cell array, in which a logic 1 information item was stored. Upon activation of the selection transistor of the memory cell, a small potential increase is established on the bit line BLl starting from a point of time of approximately 5 ns. The complementary bit line /BLl remains charged at a precharge potential of approximately 0.75 V. Starting from a point in time of approximately 17 ns, the circuit units 20 and 30 amplify the voltage level on the two bit lines to form a high voltage level VBLH of 1.5 V and, respectively, to form a low voltage level VBLL of 0 V. Starting from a point in time of approximately 32 ns, the bit lines of the memory cell array, as described in FIG. 2, are again connected to the local data lines. In a comparison with the potential states on the bit lines BLl' and /BLl' of the first subamplifier of FIG. 6, it is noticeable that the full high and low voltage potentials are assumed with a significantly shorter delay during the read-out of the memory cell.

Figure 4A:
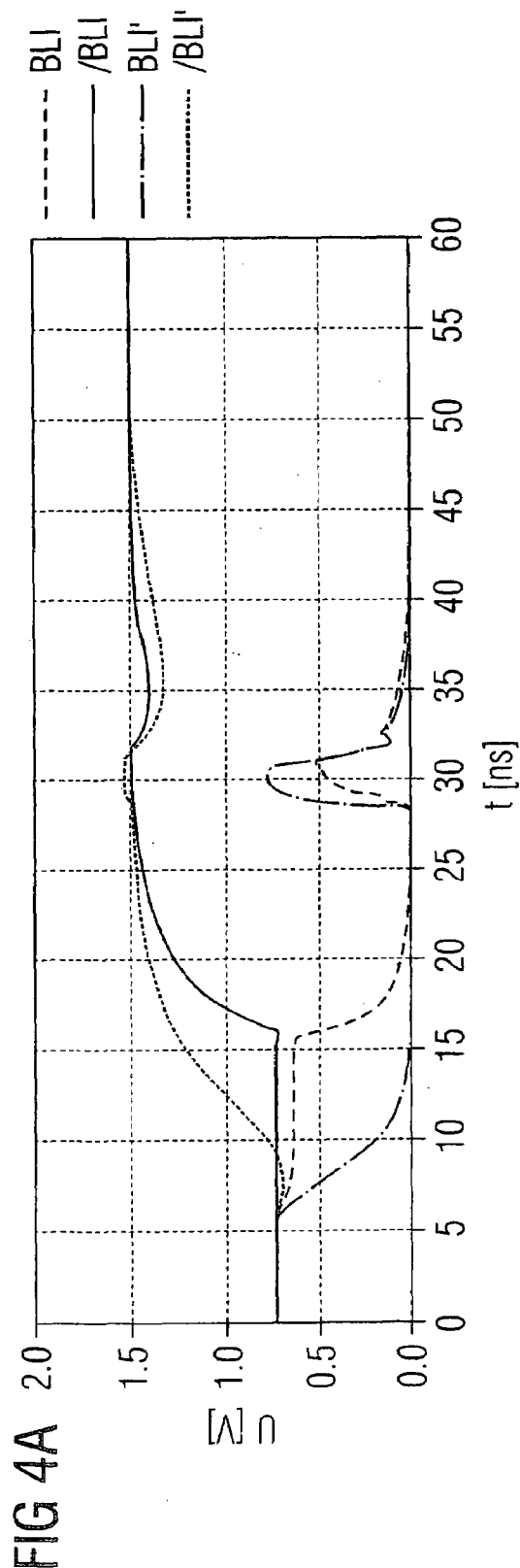
FIG. 4A shows a voltage/time diagram of a first read and write access according to the invention.
Figure 4B:
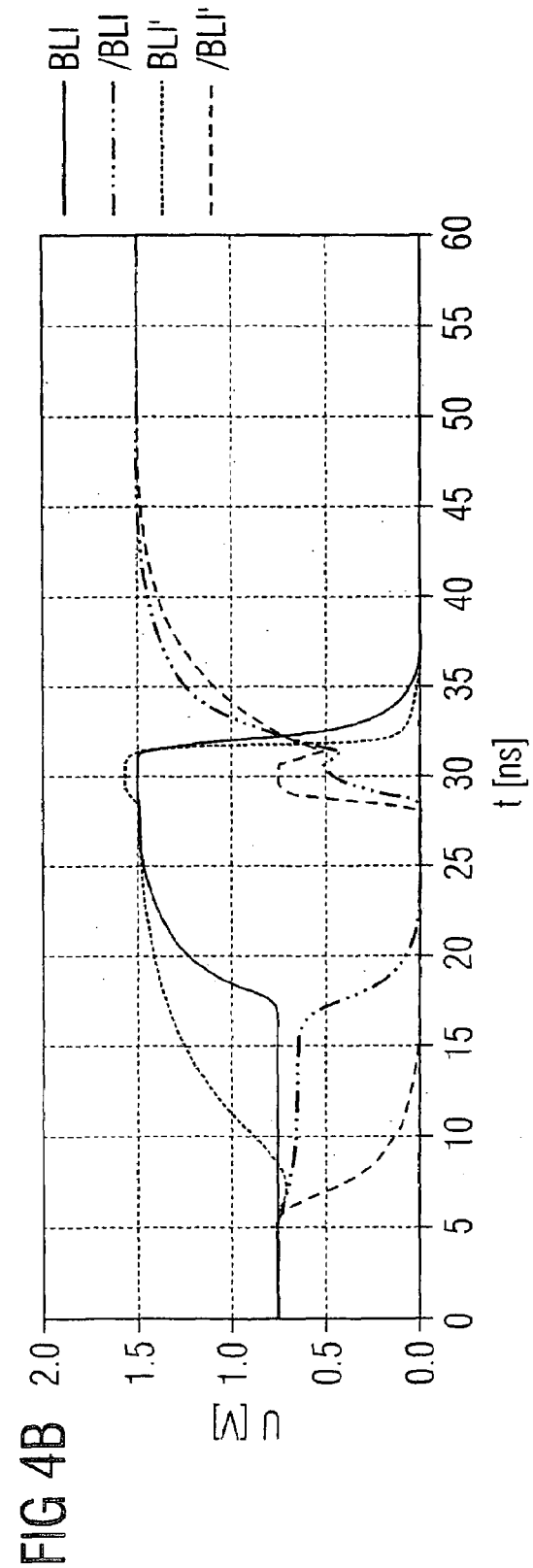
FIG. 4B shows a voltage/time diagram of a second read and write access according to the invention.

FIGS. 4A and 4B show the read-out of a memory cell in which a 0 information item was stored. FIG. 4A shows, starting from a point in time of 30 ns, the profile of the voltage level on the bit lines and the complementary bit lines when writing a 0 information item back to the memory cell. FIG. 4B shows, starting from a point in time of approximately 30 ns, the profile of the voltage level on the bit lines BLl and BLl' and on the complementary bit lines /BLl and /BLl' when writing a 1 information item back to the memory cell.

FIGS. 5A and 5B show the signal level on the bit lines BLl and BLl' and the signal level on the complementary bit lines /BLl and /BLl' during the read-out of a memory cell in which a 1 information item was stored. FIG. 5A shows, starting from a point in time of approximately 30 ns that the profile of the voltage level when writing a 0 information item back to the memory cell. FIG. 5B shows, starting from a point in time of approximately 30 ns, the profile of the voltage level when writing a 1 information item back to the memory cell.

In a comparison of the profile of the voltage level on the bit lines and the complementary bit lines of a sense amplifier in accordance with FIG. 6 and the sense amplifier in accordance with FIG. 1, the bit line BLl' and the complementary bit line /BLl' are charged relatively more rapidly to the voltage level VBLL and VBLH, respectively. In the case of a circuit arrangement corresponding to the prior art, for example, an arrangement according to FIG. 6, after activation of a memory cell, a potential increase and potential decrease occur on the bit lines of the memory cell array before the bit lines of the memory cell array are connected to the signal lines of the sense amplifier via the switching unit 50. Only afterward are the circuit units 20 and 30 activated for amplifying a high and low voltage level. In the case of a circuit arrangement according to the invention in accordance with FIG. 1, by contrast, the bit lines of the memory cell array are connected to the signal lines of the subamplifiers of the sense amplifier directly via a continuous line, i.e., without interposition of a switching transistor. Amplification of a potential increase to the high voltage level VBLH and amplification of a potential decrease to the low voltage level VBLL are therefore effected more rapidly.

In the case of the circuit arrangement of the sense amplifier according to the invention, the changeover between a first and second memory cell array is no longer affected by switching units connected between the bit lines of the memory cell array and the signal lines of the sense amplifier. The changeover is affected within the sense amplifier by use of n-channel switching transistors and p-channel switching transistors. As a result, a subamplifier is driven by a single control signal. Upon application of a first signal level of the first control signal MUXl and of the second control signal MUXr, the circuit components 20, 30, and 40 are activated for reading out, writing in, or refreshing an information item into the memory cell. Upon applying a second signal state of the same first and second control signals MUXl and MUXr, the circuit components 10 of the two subamplifiers are activated for precharging the bit lines. By contrast, the circuit arrangement of a sense amplifier according to the prior art requires the use of two additional control signals NSET and PSET for activating the circuit units 20 and 30. Likewise, two separate terminals VEINl and VEINr for applying the precharge potential VBLEQ are required for activating a precharge operation of the first and second memory cell arrays.

The direct coupling of the bit lines of the memory cell array to the signal lines of the sense amplifier prevents attenuation of a signal level, in particular, of the high voltage level VBLH, when reading in, reading out, and writing back information items into the memory cells of the memory cell array.

In order to increase the current yield, in the case of a sense amplifier circuit according to the prior art, the switching transistors 51*l*, 52*l*, 51*r*, and 52*r* were designed as transistors having a large channel width. However, since these switching transistors are obviated in the case of the new sense amplifier concept, chip area can thus be saved.

In order to further increase the current yield, moreover, the switching transistors were designed as transistors having a small channel length. In the case of transistors having small channel lengths, however, process fluctuations within the fabrication process bring about large fluctuations in the threshold voltage. The adverse influence of process fluctuations on the functional property of the sense amplifier can be reduced as a result of omitting switching transistors.

By integrating the circuit units 10*a* and 10*b* for precharging the bit lines into the two subamplifier circuits 100*a* and 100*b*, as shown in the exemplary embodiment of FIG. 1, the signal lines BSAl and BSAr are now also charged to the common precharge potential VBLEQ within the sense amplifier.

The new sense amplifier circuit has advantages with regard to the layout as well. Since the switching transistors THa and THb for driving the circuit units 20, the switching transistors TLa and TLb for driving the circuit units 30, and the switching transistors TSa and TSb for driving the circuit units 40 lie in the center of the sense amplifier, the sense amplifier is controlled by two continuous gate conductor strips.

Furthermore, the p-channel switching transistors of the circuit units 10 and 20 are designed as thick-oxide transistors and lie in the center of the sense amplifier. Within the layout, the thick-oxide transistors are therefore implemented in a continuous area. The switching transistors (designed as thick-oxide transistors) of the switching units 50*l* and 50*r* in accordance with FIG. 1 have been situated in two thin layout strips separate from one another. The required layout mask and the photolithographic process to fabricate the thick-oxide transistors can be handled more easily.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

10 Circuit unit for precharging the bit lines
11, . . . , 13 Switching transistors of the circuit unit 10
20 Circuit unit for amplifying the high voltage potential
21, 22 Switching transistors of the circuit unit 20
30 Circuit unit for amplifying the low voltage potential
31, 32 Switching transistors of the circuit unit 30
40 Circuit unit for the read-in/read-out of memory cells
41, 42 Switching transistors of the circuit unit 40
50 Switching units for connecting the sense amplifier to the first or second memory cell array
51, 52 Switching transistors of the circuit unit 50
AT Selection transistor
BL Bit line
BSA Signal line of the sense amplifier
CIN Terminal for application of the third control signal
CSL Third control signal
EIN Terminal for application of the control signal EQL
EQL Control signal for activating the precharging
LDQ Local data line
MINl Terminal for application of the first control signal
MINr Terminal for application of the second control signal
MUXl First control signal
MUXr Second control signal
NSET, PSET Control signals of the switching transistors TH, TL
S Control terminals of the switching transistors
TB Storage capacitor
TH, TL Current limiter transistor
VBLEQ Switching transistor for feeding the high and low voltage potentials
VBLH Precharge voltage
VBLH High voltage potential
VBLL Low voltage potential
VEIN Terminal for application of the precharge voltage
VINT Internal voltage potential
WIN Word line terminal
WL Control signal on the word line
/BL Complementary bit line
/BSA Complementary signal line of the sense amplifier
/LDQ Complementary local data line

What is claimed:

1. An integrated semiconductor memory with sense amplifier, comprising:

a memory cell array with a first bit line (BL1') and a second bit line (/BL1'); and the sense amplifier (100a) including a first signal line (BSA1), a second signal line (/BSA1), and a first control terminal (MIN1) for applying a first control signal (MUX1), wherein the first and second bit lines (BL1', /BL1') of the memory cell array and the first and second signal lines (BSA1, /BSA1) of the sense amplifier (100a) are formed as continuous interconnectors (BL1', /BL1', BSA1, /BSA1), the first bit line (BL1') of the memory cell array being connected to the first signal line (BSA1) of the sense amplifier (100a) via a first continuous interconnect (BL1', BSA1) and the second bit line (/BL1') of the memory cell array being connected to the second signal line (/BSA1) of the sense amplifier via a second continuous interconnect (/BL1', /BSA1), the sense amplifier (100a) including a first circuit unit (10a) having a first switching transistor (11a) with a first control terminal (S11a), having a second switching transistor (12a) with a second control terminal (S12a), and having a third switching transistor (13a) with a third control terminal (S13a), the respective control terminals (S11a, S12a, S13a) of the switching transistors (11a, 12a, 13a) of the first circuit unit (10a) being connected to the first control terminal (MIN1) for applying the first control signal (MUX1), the first circuit unit (10a) being designed to connect the first signal line (BSA1) of the sense amplifier to the second signal line (/BSA1) of the sense amplifier at a high impedance or at a low impedance depending upon a state of the first control signal (MUX1), the sense amplifier (100a) including a first and a second switching transistor (THa, TLa), each having a control terminal (S1a, S2a), each control terminal being driven by the first control signal (MUX1), the sense amplifier (100a) including a second circuit unit (20a) for feeding a first voltage potential (VBLH) to the first or second signal line (BSA1, /BSA1) of the sense amplifier, the first voltage potential (VBLH) being fed to the second circuit unit (20a) via the first switching transistor (THa) of the sense amplifier, the second circuit unit (20a) being designed to feed the first voltage potential (VBLH) to the first or second signal line of the sense amplifier if the first switching transistor (THa) of the sense amplifier is turned on by the first control signal (MUX1), the sense amplifier (100a) includes a third circuit unit (30a) for feeding a second voltage potential (VBLL) to the first or second signal line (BSA1, /BSA1) of the sense amplifier, the second voltage potential (VBLL) being fed to the third circuit unit (30a) via the second switching transistor (TLa) of the sense amplifier, the third circuit unit (30a) being designed to feed the second potential voltage (VBLL) to the first or second signal line of the sense amplifier, if the second switching transistor (TLa) of the sense amplifier is turned on by the first control signal (MUX1), the first and second switching transistors of the sense amplifier are designed as a switching transistor of the n-channel type (THa, TLa), and the switching transistors of the first circuit unit (10a) are designed as thick-oxide switching transistors of the p-channel type (11a, 12a, 13a).

2. The integrated semiconductor memory as claimed in claim 1, wherein the sense amplifier has a first input terminal (VEIN) for applying a precharge voltage (VBLEQ), the first input terminal (VEIN) for applying the precharge voltage (VBLEQ) being connected to the first signal line (BSA1) of the sense amplifier (100a) via the first and the second switching transistors (11a, 12a) of the first circuit unit (10a) and to the second signal line (/BSA1) via the first and the third switching transistors (11a, 13a) of the first circuit unit (10a) depending upon the state of the first control signal (MUX1).

3. The integrated semiconductor memory as claimed in claim 1, further comprising:

a terminal (VHIN) for applying a first voltage potential (VBLH), wherein the second circuit unit (20a) includes an input terminal (A20a), a first switching transistor (21a) with a first control terminal (S21a), and a second switching transistor (22a) with a second control terminal (S22a), the control terminal (S21a) of the first switching transistor (21a) of the second circuit unit (20a) is connected to the second signal line (/BSA1) of the sense amplifier (100a), the control terminal (S22a) of the second switching transistor (22a) of the second circuit unit (20a) is connected to the first signal line (BSA1) of the sense amplifier (100a), the first switching transistor (21a) of the second circuit unit (20a) is connected between the input terminal (A20a) of the second circuit unit and the first signal line (BSA1) of the sense amplifier (100a), the second switching transistor (22a) of the second circuit unit (20a) is connected between the input terminal (A20b) of the second circuit unit and the second signal line (/BSA1) of the sense amplifier, and the first switching transistor (THa) of the sense amplifier is connected between the terminal (VHIN) for applying the first voltage potential (VBLH) and the input terminal (A20a) of the second circuit unit (20a).

4. The integrated semiconductor memory as claimed in claim 3, wherein the first and second switching transistors of the second circuit unit (20a) are designed as p-channel field effect transistors (21a, 22a).

5. The integrated semiconductor memory as claimed in claim 1, further comprising:

a terminal (VLIN) for application of a second voltage potential (VBLL), wherein the third circuit unit (30a) includes an input terminal (A30a), a first switching transistor (31a) with a first control terminal (S31a), and a second switching transistor (32a) with a second control terminal (S32a), the control terminal (S31a) of the first switching transistor (31a) of the third circuit unit (30a) is connected to the second signal line (/BSA1) of the sense amplifier (100a), the control terminal (S32a) of the second switching transistor (32a) of the third circuit unit (30a) is connected to the first signal line (BSA1) of the sense amplifier (100a), the first switching transistor (31a) of the third circuit unit (30a) is connected between the input terminal (A30a) of the third circuit unit and the first signal line (BSA1) of the sense amplifier (100a), the second switching transistor (32a) of the third circuit unit (30a) is connected between the input terminal (A30a) of the third circuit unit and the second signal line (/BSA1) of the sense amplifier, and the second switching transistor (TLa) of the sense amplifier (100a) is connected between the terminal (VLIN) for applying the second voltage potential (VBLL) and the input terminal (A30a) of the third circuit unit (30a).

6. The integrated semiconductor memory as claimed in claim 5, wherein the first and the second switching transistors of the third circuit unit (30a) are designed as n-channel field effect transistors (31a, 32a).

7. The integrated semiconductor memory as claimed in claim 1, further comprising: a first data line (LDQ);

a second data line (/LDQ); and a second control terminal (CIN) for applying a second control signal (CSL), wherein the sense amplifier (100a) includes a fourth circuit unit (40a) for connecting the first signal line (BSA1) to the first data line (LDQ) and for connecting the second signal line (/BSA1) to the second data line (/LDQ) with a control terminal (S40a) and a third switching transistor (TSa) with a third control terminal (S3a), the third switching transistor (TSa) of the sense amplifier is connected between the second control terminal (CIN) of the sense amplifier and the control terminal (S40a) of the fourth circuit unit (40a), the control terminal (S3a) of the third switching transistor (TSa) of the sense amplifier (100a) is connected to the first control terminal (MIN1) for applying the first control signal (MUX1), the second control terminal (CIN) of the sense amplifier is connected to the control terminal (S40a) of the fourth circuit unit (40a) at a low impedance or at a high impedance depending upon the state of the first control signal (MUX1), and depending upon a state of the second control signal (CSL), the first signal line (BSA1) is connected to the first data line (LDQ) and the second signal line (/BSA1) is connected to the second data line (/LDQ) at a low impedance or at a high impedance.

8. The integrated semiconductor memory as claimed in claim 7, wherein the third switching transistor of the sense amplifier is an n-channel field effect transistor (TSa).

9. The integrated semiconductor memory as claimed in claim 7, wherein the fourth circuit unit (40a) includes a first switching transistor (41a) with a first control terminal (S41a), and a second switching transistor (42a) with a second control terminal (S42a), the first control terminal (S41a) of the first switching transistor (41a) of the fourth circuit unit (40a) is connected to the control terminal (S40a) of the fourth circuit unit (40a), the second control terminal (S41a) of the second switching transistor (42a) of the fourth circuit unit (40a) is connected to the control terminal (S40a) of the fourth circuit unit (40a), the first switching transistor (41a) of the fourth circuit unit (40a) is connected between the first signal line (BSA1) of the sense amplifier (100a) and the first data line (LDQ), and the second switching transistor (42a) of the fourth circuit unit (40a) is connected between the second signal line (/BSA1) of the sense amplifier (100a) and the second data line (/LDQ).

10. The integrated semiconductor memory as claimed in claim 9, wherein the first and second switching transistors of the fourth circuit unit (40a) are an n-channel field effect transistor (41a, 42a).

11. The integrated semiconductor memory as claimed in claim 7, wherein the sense amplifier includes a first subamplifier (100a) and a second subamplifier (100b), the subamplifiers each having first, second, third, and fourth circuit units (10a, 20a, 30a, 40a, 10b, 20b, 30b, 40b), and the switching transistors (11a, 12a, 13a, 21a, 22a, 11b, 12b, 13b, 21b, 22b) of the first and second circuit units (10a, 20a, 10b, 20b) of the subamplifiers (100a, 100b) are introduced in a common well.

12. The integrated semiconductor memory as claimed in claim 1, wherein the first bit line (BL1') is connected to a memory cell (SZ1), the memory cell (SZ1) includes a selection transistor (AT1) and a first storage capacitor (SC1), the second bit line (/BL1') is connected to a second storage capacitor (SC1'), and the first storage capacitor (SC1) of the memory cell (SZ1) is charged to the first voltage potential (VBLH) and the second storage capacitor (SC1') is charged to the second voltage potential (VBLL).

13. A method for operating an integrated semiconductor memory with a sense amplifier, comprising:

applying a first state of a first control signal (MUX1) to a first control terminal (MIN1) of the sense amplifier (10a);

controlling first, second, and third switching transistors (11a, 12a, 13a) of the first circuit unit (10a) into an off state;

controlling first, second, and third switching transistors (THa, TLa, TSa) of the sense amplifier (100a) into an on state;

applying a first state of a second control signal (CSL) to a second control terminal (CIN) of the sense amplifier;

controlling first and second switching transistors (41a, 42a) of a fourth circuit unit (40a) into the on state, whereby a first signal line (BSA1) of the sense amplifier is connected to a first data line (LDQ) and a second signal line (/BSA1) of the sense amplifier is connected to a second data line (/LDQ) at a low impedance; and carrying out a read or write access in the memory cell array.

14. The method for operating an integrated semiconductor memory as claimed in claim 13, further comprising:

applying a second state of the second control signal (CSL) to the second control terminal (CIN) of the sense amplifier;

controlling the first and second switching transistors (41a, 42a) of the fourth circuit unit (40a) into an off state, whereby the first signal line (BSA1) of the sense amplifier is connected to the first data line (LDQ) and the second signal line (/BSA1) of the sense amplifier is connected to the second data line (/LDQ) at a high impedance; and carrying out a refresh operation in the memory cell array.

15. The method for operating an integrated semiconductor memory as claimed in claim 13, further comprising:

applying a second state of the second control signal (CSL) to the second control terminal (CIN) of the sense amplifier;

controlling the first and second switching transistors (41a, 42a) of the fourth circuit unit (40a) into an off state, whereby the first signal line (BSAl) of the sense amplifier is connected to the first data line (LDQ) and the second signal line (/BSAl) of the sense amplifier is connected to the second data line (/LDQ) at a high impedance;

applying a second state of the first control signal (MUX1) to the first control terminal (MIN1) of the sense amplifier (100a);

controlling the first, second and third switching transistors (11a, 12a, 13a) of the first circuit unit (10a) into an on state;

controlling the first, second and third switching transistors (THa, TLa, TSa) of the sense amplifier (100a) into an off state; and precharging the first and second signal lines (BSAl, /BSAl) of the sense amplifier (100a) and the first and second bit lines (BLr', /BLr') of the memory cell array to a predetermined voltage potential.

16. The method for operating an integrated semiconductor memory as claimed in claim 15, wherein the predetermined voltage potential is a voltage potential value in a range between a first voltage potential (VBLH) and a second voltage potential (VBLL).

* * * * *

UNITED STATES PATENT AND TRADEMARK OFFICE
CERTIFICATE OF CORRECTION

PATENT NO. : 7,126,870 B2  
APPLICATION NO. : 11/068491  
DATED : October 24, 2006  
INVENTOR(S) : Helmut Schneider et al.

It is certified that error appears in the above-identified patent and that said Letters Patent is hereby corrected as shown below:

Col 10, line 34:   replace "10b" with -- 100b --

Col. 20, line 32:   replace "10a" with -- 100a --

Signed and Sealed this

Twentieth Day of November, 2007

JON W. DUDAS  
*Director of the United States Patent and Trademark Office*